(12) United States Patent
Lorenz et al.

(10) Patent No.: US 6,238,243 B1
(45) Date of Patent: May 29, 2001

(54) SUPPORT ASSEMBLY FOR RACK-MOUNTED INSTALLATION OF PRINTED CIRCUIT BOARDS

(75) Inventors: Alan S. Lorenz, Everett; William D. Regester, Bothell, both of WA (US)

(73) Assignee: Leviton Manufacturing Co., Inc., Little Neck, NY (US)

( * ) Notice: Subject to any disclaimer, the term of this patent is extended or adjusted under 35 U.S.C. 154(b) by 0 days.

(21) Appl. No.: 08/906,690

(22) Filed: Aug. 6, 1997

(51) Int. Cl.[7] .............................. H01R 13/73; H02B 1/01
(52) U.S. Cl. ............................................. 439/553; 439/551
(58) Field of Search ........................... 439/540.1, 553, 439/557, 476.1, 535, 536

(56) References Cited

U.S. PATENT DOCUMENTS

| | | |
|---|---|---|
| 3,851,222 | * 11/1974 | Michalak et al. .................. 361/757 |
| 4,427,254 | 1/1984 | Koppensteiner . |
| 5,569,040 | * 10/1996 | Sumida ............................ 439/540.1 |

FOREIGN PATENT DOCUMENTS

| | | |
|---|---|---|
| 377902 | 6/1964 | (CH) . |
| 0 175 942 A1 | 4/1986 | (EP) . |
| 2088140A | 6/1982 | (GB) . |

OTHER PUBLICATIONS

Leviton Telcom product brochure, Leviton Manufacturing Co., Inc., Bothell, Washington, 1995, front cover, pp. A10, D4, D6, D11, D12, D17, E5 and back cover. No Month.

* cited by examiner

Primary Examiner—Tulsidas Patel
Assistant Examiner—Javaid Nasari
(74) Attorney, Agent, or Firm—Seed IP Law Group PLLC

(57) ABSTRACT

A support assembly for supporting a circuit board in an equipment rack or similar structure. The assembly includes a circuit board defining a substantially flat board plane and a mounting member that supports the circuit board in the equipment rack. The assembly further includes a support positioned between and attached to the mounting member and the circuit board. The support has engagement portions which engage the circuit board and substantially prevents the circuit board from bending out of the board plane.

43 Claims, 3 Drawing Sheets

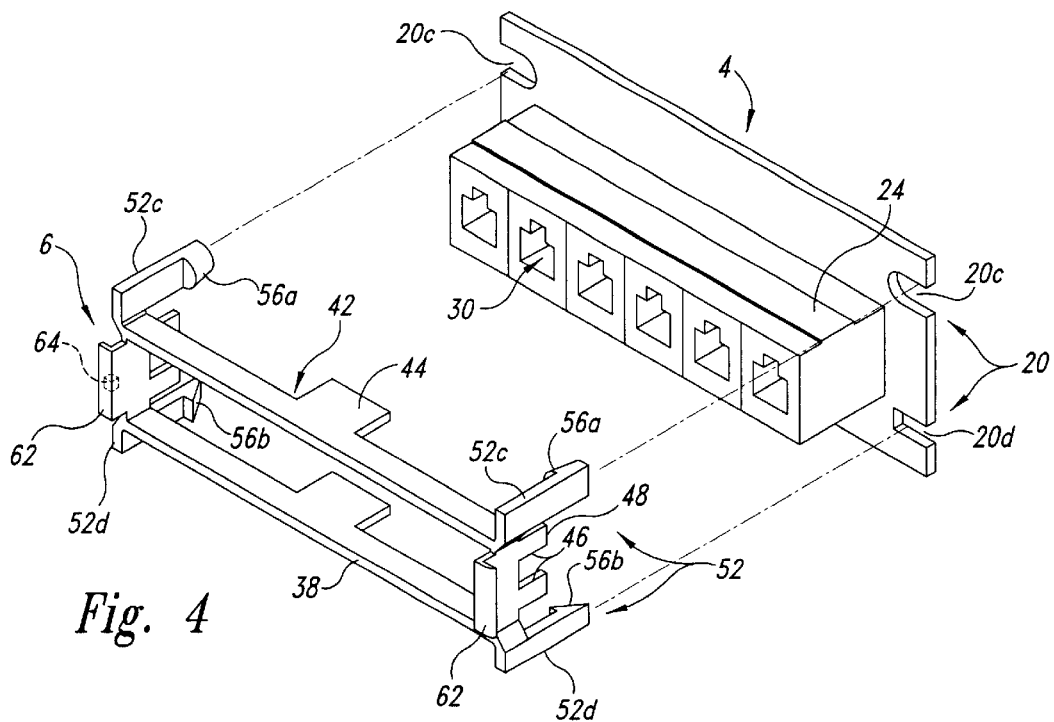
Fig. 4
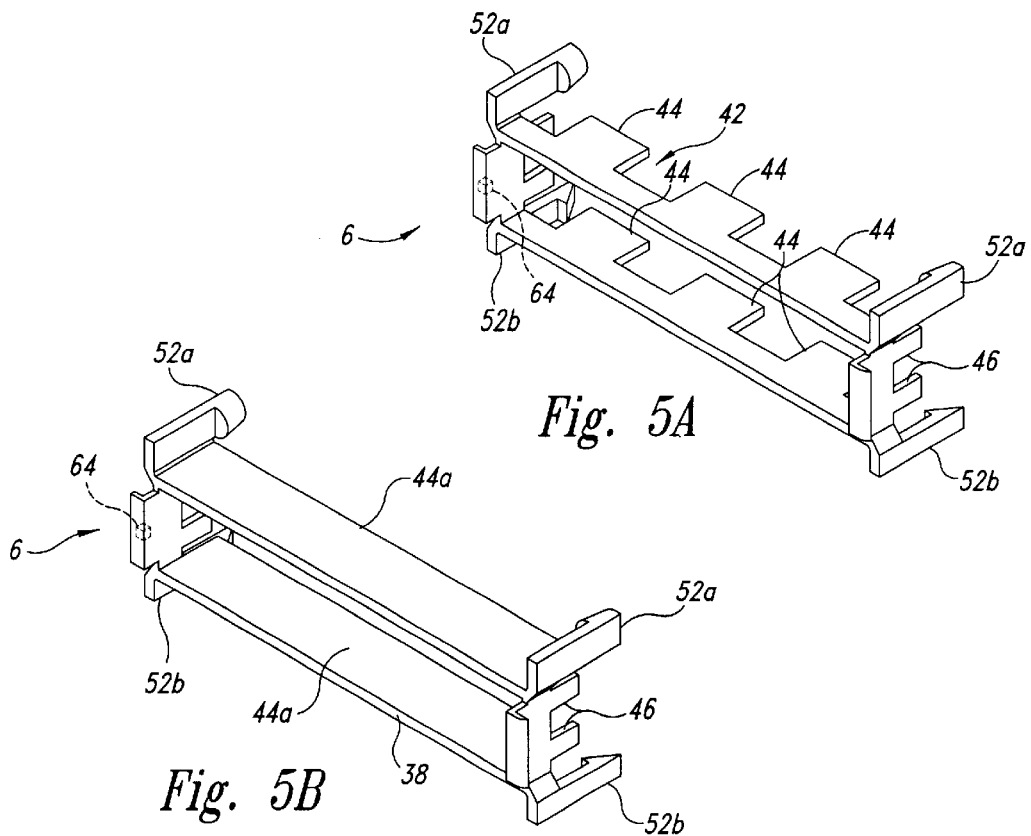
Fig. 5A
Fig. 5B

SUPPORT ASSEMBLY FOR RACK-MOUNTED INSTALLATION OF PRINTED CIRCUIT BOARDS

TECHNICAL FIELD

The present invention is directed toward a printed circuit board support assembly and more particularly, toward a support assembly for rack-mounted installation of a printed circuit board.

BACKGROUND OF THE INVENTION

Circuit boards are used extensively in the computer and telecommunications industries. The circuit boards provide compact surfaces for mounting and interconnecting electrical connectors and electronic components. Cables are fixedly or removably connected to the electrical connectors to provide electrical signals to components positioned on the same or different circuit boards. The printed circuit boards thus provide convenient platforms for interconnecting telecommunication or computer devices.

In one conventional installation, a circuit board is attached to a faceplate which is in turn attached to an equipment rack comprising two spaced-apart vertical support members. The faceplate and circuit board span the space between the support members and are positioned so that cables may be easily connected to connectors on either a front surface or rear surface of the circuit board. The cables are permanently or semi-permanently connected to the connectors either before or after the circuit board is secured in position to the rack. On occasion, the cables must be rerouted to different connector terminals on the same circuit board or rerouted to connectors on a different circuit board. Rerouting the cables requires that the cables be disconnected from their original connectors and reconnected to different connectors. To save time, the cables are often rerouted while the circuit board and face plate remain attached to the rack, rather than first removing the circuit board from the rack, with or without the face plate, rerouting the cables, and then reattaching the circuit board to the rack.

One drawback of conventional rack-mounted circuit boards is that the circuit boards flex and may break when cables are connected to or disconnected from the connectors positioned thereon. The circuit boards are especially likely to flex if the cables are connected to or disconnected from the circuit boards while they remain attached to the spaced apart support members of the equipment rack. A further drawback of conventional rack-mounted circuit boards is that, as they flex, they may cause electrical connections between the cables and the connectors to loosen or break, disrupting the flow of electrical signals to and from the circuit board.

SUMMARY OF THE INVENTION

The present invention is directed toward a support. Other aspects of the invention include a support assembly for supporting a circuit board in an equipment rack or similar structure. In one embodiment of the invention, the assembly includes a circuit board having first and second opposite-facing surfaces and defining a board plane. The assembly further includes a mounting member sized and shaped to be attached to the equipment rack to support the mounting member and the circuit board relative to the rack. A support is positioned between the mounting member and the circuit board to couple the mounting member to the circuit board proximate to the first surface of the circuit board. The support comprises a frame which includes an engaging portion positioned to releasably engage the first surface of the circuit board to resist bending of the circuit board out of the board plane and toward the mounting member when the circuit board and the support are coupled together. The support further comprises a board coupler connected to the frame and positioned to be removably coupled to the circuit board. The support additionally comprises a mount coupler which is connected to the frame and is positioned to be removably coupled to the mounting member.

One aspect of the invention includes a circuit board having first and second opposite end portions and an intermediate portion therebetween. The engaging portion of the support is positioned to releasably engage the first surface of the circuit board toward both the first and second end portions thereof.

In a further aspect of the invention, the board coupler releasably engages the second surface of the circuit board and biases the circuit board toward the engaging portion. The board coupler accordingly resists movement of the circuit board out of the board plane and away from the mounting member when the circuit board and the support are coupled together.

In yet a further aspect of the invention, the board coupler includes a first board coupling member and a second board coupling member smaller than the first board coupling member. The circuit board includes a first aperture and a second aperture, the first aperture being sized and shaped to releasably engage the first board coupling member, the second aperture being smaller than the first aperture and sized and shaped to releasably engage the second board coupling member. Accordingly, the second aperture substantially prevents engagement with the first board coupling member to allow coupling of the circuit board to the support in only a selected orientation.

The present invention also provides a method for supporting a circuit board having first and second opposite-facing surfaces and defining a board plane. The method includes releasably attaching a support to the circuit board and releasably attaching the support to a mounting member. The method further includes engaging a portion of the support with at least one of the first and second surfaces of the circuit board to stiffen the circuit board against movement of the circuit board out of the board plane.

These and other aspects of this invention will become evident upon reference to the following detailed description and attached drawings.

BRIEF DESCRIPTION OF THE DRAWINGS

FIG. 4 is an exploded isometric view of a first alternate embodiment of a support and circuit board of a circuit board assembly in accordance with the invention.

FIG. 5A is an isometric view of a second alternate embodiment of a circuit board assembly support in accordance with the invention.

FIG. 5B is an isometric view of a third alternate embodiment of a circuit board assembly support in accordance with the invention.

DETAILED DESCRIPTION OF THE INVENTION

Figure 1:
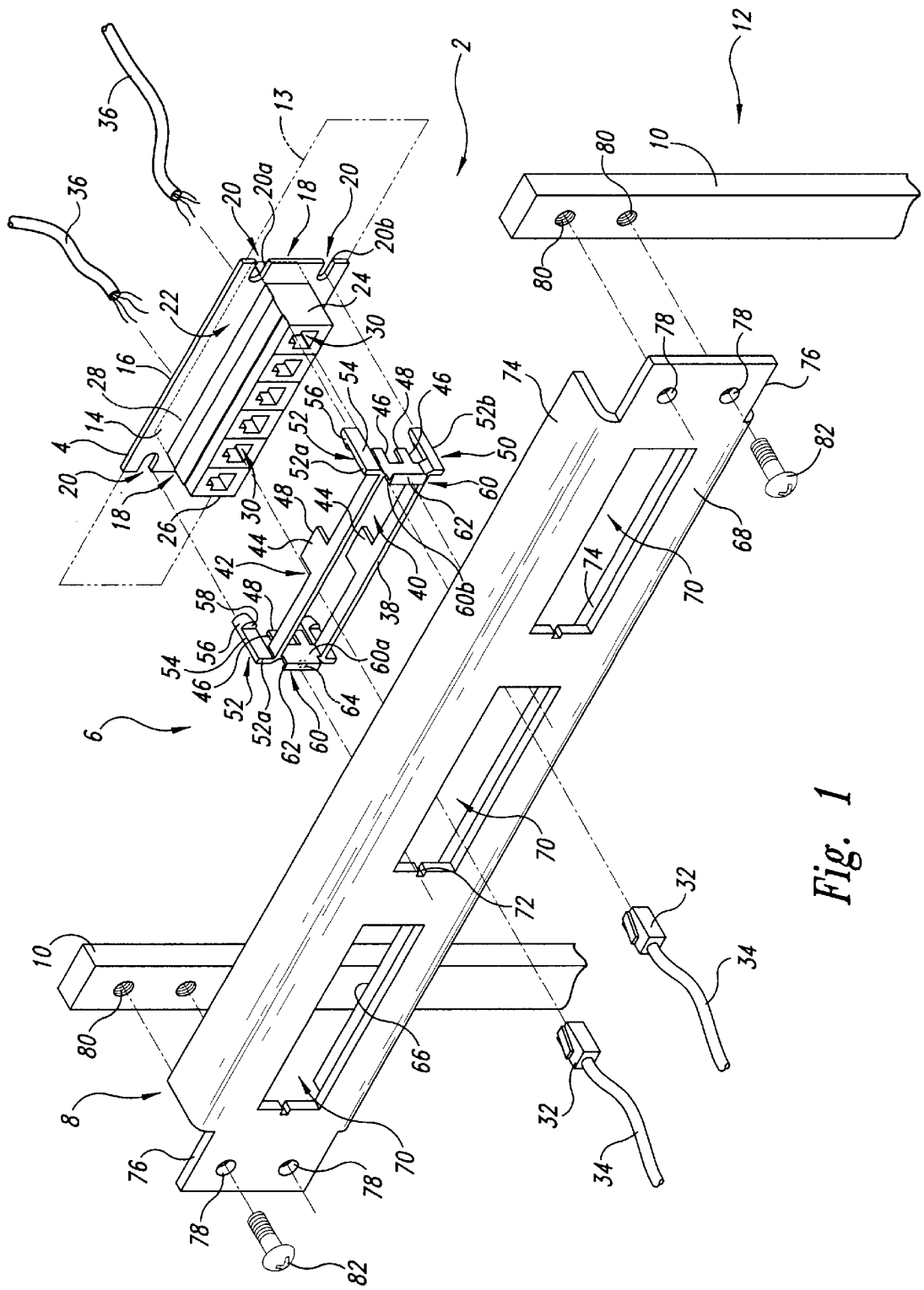
FIG. 1 is an exploded isometric view of a circuit board assembly in accordance with the invention, positioned for attachment to an equipment rack.
Figure 2:
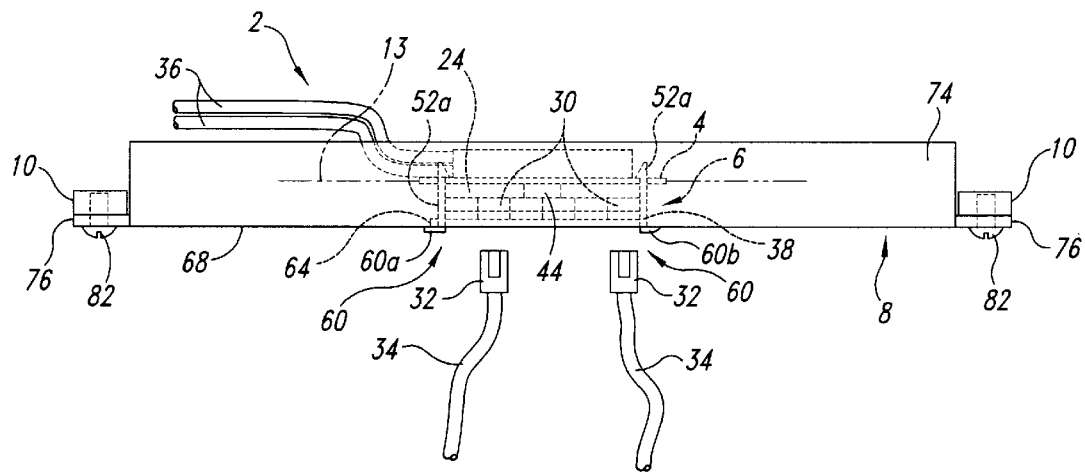
FIG. 2 is a top plan view of the circuit board assembly of FIG. 1, shown fully assembled and attached to the equipment rack.
Figure 3:
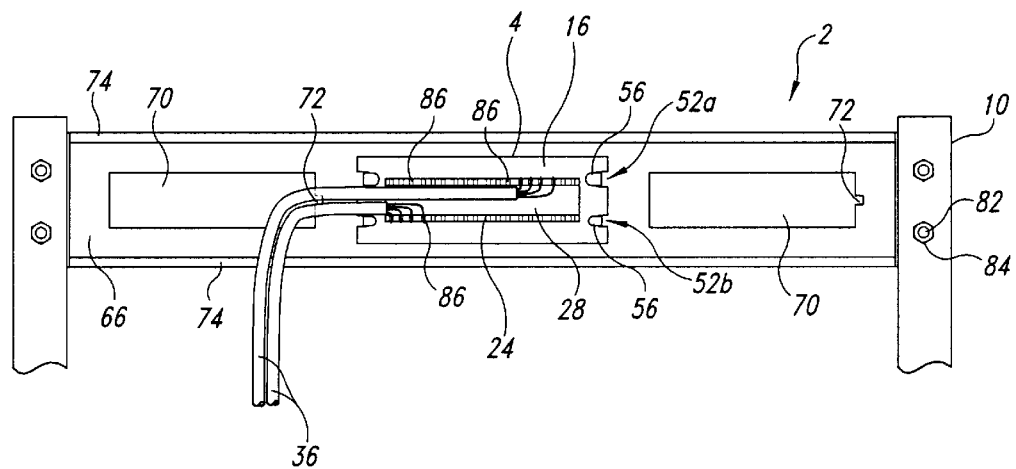
FIG. 3 is a rear elevation view of the circuit board assembly of FIG. 1, shown fully assembled and attached to the equipment rack.

The present invention is directed toward a circuit board assembly for supporting a circuit board. The circuit board assembly allows a user to connect cables to and disconnect cables from the circuit board while the circuit board is attached to an equipment rack without causing the circuit board to flex unnecessarily, thereby preventing the circuit board and the electrical connections thereon from breaking. A representative circuit board assembly 2 in accordance with one embodiment of the present invention is shown in FIGS. 1–3 for the purposes of illustration. As is best seen in FIG. 1, the circuit board assembly 2 preferably includes an elongated circuit board 4 connected to a support 6 which is in turn connected to a mounting member 8. The mounting member 8 is removably connected to a pair of vertical rack posts or members 10 of an equipment rack 12 to support the circuit board 4 relative to the equipment rack. The rack members 10 are in spaced apart parallel relation.

The circuit board 4 is substantially flat and defines a substantially flat board plane 13, shown schematically in phantom lines in FIG. 1. The circuit board 4 is at least partially flexible in a direction normal to the board plane 13, and accordingly has a tendency to flex out of the board plane when a transverse force is applied thereto in a normal direction. The circuit board 4 has an inner surface 14 facing toward the support 6 and an outer surface 16 facing away from the support. The inner surface 14 has end portions 18 toward each end of the circuit board 4. Four board apertures 20 are positioned in the end portions 18 to releasably connect the circuit board 4 to the support 6 as will be discussed more fully below.

The circuit board 4 preferably includes an intermediate portion 22 positioned between the end portions 18. An electrical connector 24 is positioned in the intermediate portion 22 and affixed to the circuit board. The electrical connector 24 has a forward portion 26 projecting forward beyond the inner surface 14 of the circuit board 4, and a rear portion 28 projecting rearward beyond the outer surface 16 of the circuit board. The forward portion 26 includes a plurality of jack receptacles 30, each configured to releasably receive a jack plug 32 of front-mounted cables or leads 34. The rear portion 28 is configured to have the rear-mounted cables or leads 36 connected thereto, as will be discussed below. The cables 34 and 36 conduct electrical signals to and from the circuit board 4 which may be routed to other circuit boards or devices, or which may be routed to components (not shown) on the circuit board.

The circuit board 4 is removably connected to the support 6. In the illustrated embodiment, the support 6 comprises a frame 38 which faces the inner surface 14 of the circuit board 4. The frame 38 defines a frame opening 40 which is sized and shaped to allow the forward portion 26 of the electrical connector 24 to project forward at least partially therethrough when the support 6 and circuit board 4 are connected together. The frame 38 has a sufficiently thick cross section in a direction normal to the board plane 13 to resist bending forward when a forward force is applied to the circuit board in the normal direction. The frame 38 has a relatively thin cross section in a direction parallel to the board plane 13 so that the frame may flex slightly when it is connected to the mounting member 8, as will be discussed in greater detail below.

The frame 38 includes an engaging portion 42 which is positioned to engage the inner surface 14 of the circuit board 4. In the illustrated embodiment, the engaging portion 42 includes a pair of central engaging members 44 which project rearward away from the frame 38 and toward the inner surface 14 to engage the intermediate portion 22 of the inner surface. The engaging portion 42 further includes end engaging members 46 which project rearward away from the frame 38 to engage the end portions 18 of the inner surface 14. The central engaging members 44 and end engaging members 46 each have an engaging surface 48 which bears against the inner surface 14 and are in coplanar arrangement. The engaging members 44 and 46 accordingly resist bending of the circuit board 4 forward out of the board plane toward the support 6 and the mounting member 8 when the support is connected to the circuit board and mounting member. The engaging surfaces 48 are preferably flat to engage along their full length the flat inner surface 14 of the circuit board 4. This distributes the force over the inner surface 14. In alternate embodiments, the engaging surfaces 48 have other shapes corresponding to circuit boards having non-planar surfaces.

The support 6 further includes a board coupler 50 for coupling the support to the circuit board 4. In the illustrated embodiment, the board coupler 50 includes four board coupling members 52 extending rearward away from the frame 38 and toward and beyond the circuit board 4. The board coupling members 52 each have a resilient shank 54 extending away from the frame 38 and terminating in a coupling portion 56. When the support 6 is positioned adjacent to the circuit board 4 for coupling thereto, the shanks 54 extend through corresponding ones of the board apertures 20 so that the coupling portions 56 are adjacent the outer surface 16 of the circuit board. The coupling portions 56 have coupler engaging surfaces 58 that face toward the frame 38 and snugly engage the outer surface 16 of the circuit board 4. The board coupling members 52 accordingly removably couple the support 6 to the circuit board 4 and support it in position relative to the frame 38. Furthermore, by engaging the outer surface 16 of the circuit board 4, the board coupling members 52 resist any tendency for the circuit board to bend rearward out of the board plane 13 away from the support 6 and mounting member 8 when the support is connected to the circuit board.

In the illustrated embodiment, the coupler engaging surfaces 58 engage the outer surface 16 of the circuit board 4 while the engaging surfaces 48 of the engaging portion 42 engage the inner surface 14 to securely hold the circuit board therebetween against forward and rearward movement. The board coupling members 52 also bias the circuit board 4 into engagement with the engaging portion 42, firmly clamping the circuit board in place against the engaging portion. The engaging portion 42 and board coupling members 52 together resist the tendency for the circuit board 4 to bend out of the board plane 13 either toward or away from the support 6.

The board coupling members 52 preferably include a pair of upper board coupling members 52a and a pair of lower board coupling members 52b. Similarly, the board apertures 20 include corresponding pairs of upper and lower board apertures 20a and 20b, respectively. The upper board coupling members 52a are sized and shaped to fit through the upper board apertures 20a and the lower board coupling members 52b are sized and shaped to fit through the lower board apertures 20b. In the illustrated embodiment, the upper board coupling members 52a are too large to fit through the lower board apertures 20b so that the support 6 can only be coupled to the circuit board 4 when the upper board couplers 52a engage the upper board apertures 20a. Thus, the board coupling members 52 further serve to couple the support 6 and the circuit board 4 in only a preferred orientation.

In the illustrated embodiment, the board coupling members 52 are sufficiently rigid to firmly engage the circuit board 4, yet sufficiently flexible that they may be easily disengaged from the board apertures 20. Accordingly, the circuit board 4 may be easily separated from the support 6 for repairs, replacement or other purposes by bending the board coupling members 52 laterally outward such that the circuit board will clear the coupling portions 56 of the board coupling members when the circuit board is moved rearward. In alternate embodiments nuts and bolts, rivets or other conventional attachment means (not shown) may be used to fixedly or releasably attach the circuit board 4 to the support 6.

The support 6 further includes two mount couplers 60 projecting forward away from the frame 38 to releasably connect the support to the mounting member 8. The mount couplers 60 have attachment portions or flanges 62 projecting laterally outward and configured to engage the mounting member 8 at the ends of an elongated mount aperture 70 in the mounting member at which mounted and couple the support 6 to the mounting member. One mount coupler 60a has an attachment portion which includes a tab member 64. The other mount coupler 60b has no tab member. The tab member 64 is positioned to orient the support 6 relative to the mounting member 8, as will be discussed in greater detail below.

The mounting member 8 has an inner surface 66 facing the support 6 and an outer surface 68 facing away from the support. The illustrated mounting member 8 includes three elongated mount apertures 70 for mounting of three supports 6, only one being shown in FIG. 1. The mount apertures 70 each extend between the inner surface 66 and outer surface 68 and are each sized to engage the mount couplers 60 of one support 6 and allow access through the mounting aperture 70 of the mounting member 8 to the electrical connector 24 mounted on the circuit board 4. In the illustrated embodiment, each mount aperture 70 is sized to receive both mount couplers 60a and 60b of the support 6. In the illustrated embodiment, each mount aperture 70 has a notch 72 at one end thereof sized and shaped to receive the tab member 64 of the mount coupler 60a. Because only the mount coupler 60a has a tab portion 64 and mount coupler 60b does not, the support 6 can be mounted to the mounting member 8 in a preferred orientation only.

The mounting member 8 further includes upper and lower, rearward projecting flange portions 74 which extend along the length thereof. The flange portions 74 provide rigidity to the mounting member 8 to prevent its bending, especially under the large forward force applied when connecting the cables 36 to the circuit board 4. The mounting member 8 shown in FIG. 1 includes three mount apertures 70, each capable of receiving one support 6 and attached circuit board 4; however, the mounting member may be sized to receive more or fewer supports 6 and circuit boards 4, as desired and as space allows.

The mounting member 8 also includes attachment portions or flanges 76 which project laterally away from the opposing ends of the mounting member. The attachment flanges 76 each include a pair of mounting holes 78 which are aligned with corresponding threaded rack mounting holes 80 of the rack members 10. The mounting member 8 is connected to the rack member 10 using bolts 82 which pass through the aligned mounting holes 78 and are threadably received in the rack mounting holes 80. In alternate embodiments, other means may be used to secure the mounting member 8 to the rack members 10, such as quick release connectors. The mounting member 8 may be adapted to mount to structures other than racks without deviating from the scope of the present invention.

Installation and operation of an embodiment of the present invention is best understood with reference to FIGS. 1–3. The support 6 is mounted to the mounting member 8 by aligning the mount couplers 60 with the mount aperture 70 at which they are to be mounted such that the tab member 64 is aligned with the notch 72 of the mount aperture. Mount coupler 60a is then passed through the mount aperture 70 so that it engages the outer surface 68 of the mounting member 8 as is best seen in FIG. 2 with the tab member 64 received in the notch 72. The frame 38 is then compressed slightly laterally inward to fit the mount coupler 60b through the mount aperture 70. The frame 38 and mount coupler 60b are then released allowing the frame to snap into place with both attachment flanges 62 of the mount couplers 60 engaging the outer surface 68 of the mounting member 8.

The circuit board 4 is then coupled to the support 6 by aligning the upper board coupling members 52a with the upper board apertures 20a and the lower board coupling members 52b with the lower board apertures 20b. The circuit board 4 is moved toward the support 6 until the coupling portions 56 of the board coupling members 52a and 52b pass through the corresponding apertures 20a and 20b, respectively. The shanks 54 of the board coupling members 52 are sufficiently flexible to allow the coupling portions 56 to move laterally outward relative to the frame 6 as they pass through the board apertures 20. When the coupling portions 56 have passed completely through the corresponding board apertures 20, they snap into place with the coupler engaging surfaces 58 engaging the outer surface 16 of the circuit board 4. At this point, the engaging surfaces 48 of the engaging portion 42 simultaneously engage the inner surface 14 of the circuit board 4. The mounting member 8 with support 6 and circuit board 4 attached thereto may then be mounted to the rack members 10 using the bolts 82 in a conventional manner, as shown in FIG. 2. Alternatively, the mounting member 8 may first be attached to the rack members 10. The support 6 may then be attached to the mounting member 8, and the circuit board 4 attached to the support as discussed above.

Once the circuit board assembly 2 has been assembled and mounted to the rack members 10, the cables 34 and 36 are coupled to the circuit board 4 by attaching the cables to the electrical connector 24. The front-mounted cables 34 are releasably connected to the electrical connector 24 by inserting the jack plugs 32 into the jack receptacles 30 in a conventional manner. The rear-mounted cables 36 are fixedly or releasably connected to the electrical connector 24 as is best shown in FIGS. 2 and 3. The electrical connector 24 includes connector elements 86 which may comprise insulation displacement connectors (IDCs) having V-shaped terminals, or may comprise pins, sockets or other connection means known in the art. The rear-mounted cables 36 are connected directly to the connector elements 86 by physically engaging the ends of the cables with the connector elements 86 and/or soldering the cables to the connector elements. Both the front-mounted cables 34 and the rear-mounted cables 36 may later be disconnected from and reconnected to the electrical connector 24, as desired.

As the cables 34 and 36 are connected to or disconnected from the circuit board 4, either manually or with the aid of tools, considerable forces may be applied to the circuit board in a direction normal to the board plane 13, tending to bend the circuit board 4 out of the board plane. Where the connector elements 86 are IDCs, high-impact tools are used to force the rear-mounted cables 36 into engagement with the connector elements. A large amount of force must be exerted by the tool in order to both cut insulation on the rear-mounted cables 36 and engage the wires of the cables with the IDCs to ensure good physical and electrical contact between the cables and the connectors. Where several wires of a rear-mounted cable 36 are connected to the electrical connector 24, the tool must either exert a large amount of force several times to individually connect each of the wires or, if the tool is adapted to do so, exert an even larger force to simultaneously connect several wires to the electrical connector.

An advantage of the illustrated embodiment of the invention is that when the cables 34 and 36 are connected to or disconnected from the electrical connector 24, the support 6 restricts motion of the circuit board 4 out of the board plane 13. More specifically, the engaging portion 42 restricts motion of the circuit board 4 toward the frame 38, and the board coupling members 52 restrict motion of the end portions 18 of the circuit board away from the frame. In the case of a forward force, the engaging portion 42 provides support against forward movement at both ends of the circuit board 4 by the end engaging members 46 which engage the end portions 18 of the circuit board and at the center of the circuit board by the central engaging members 44 which engage the intermediate portion 22 of the circuit board. Accordingly, the likelihood that the circuit board 4 or the electrical connections thereon will fail is substantially reduced even though the cables may be repeatedly connected to and disconnected from the circuit board.

A further advantage of an embodiment of the circuit board assembly 2 is that the circuit board 4, support 6, and mounting member 8 comprising the assembly are removably interconnected. Accordingly, any one of the components comprising the assembly may be easily replaced, if necessary, without replacing the entire assembly. Yet a further advantage of an embodiment of the assembly 2 is that the components comprising the assembly are configured to be assembled in a preferred orientation only. Accordingly, the components may be easily and properly assembled by users without chance for assembly in reverse orientation.

FIG. 4 illustrates a first alternate embodiment of the support 6 and circuit board 4 in accordance with the invention. As shown in FIG. 4, the board apertures 20 include upper board apertures 20c having a substantially elliptical shape and lower board apertures 20d having a substantially rectangular shape. The board coupling members 52 projecting away from the frame 38 of the support 6 include upper board coupling members 52c each having a coupler engaging portion 56a with a semi-circular cross-sectional shape to engage the upper board apertures 20c, and lower board coupling members 52d each having a rectangular cross-sectional shape coupling portion 56b with a rectangular cross-sectional shape to engage the lower board apertures 20d. Accordingly, the board coupling members 52 and board apertures 20 are shaped to permit assembly of the circuit board 4 and the support 6 in a preferred orientation only. In further alternate embodiments, the board coupling members 52 and board apertures 20 may have shapes other than those shown in FIGS. 1 and 4 to orient the support 6 relative to the printed circuit board 4 in a preferred orientation only.

FIG. 5A illustrates a second alternate embodiment of the support 6 having six central engaging members 44. Each central engaging member 44 engages the intermediate portion 22 of the circuit board inner surface 14. FIG. 5B illustrates a third alternate embodiment of the support 6 having two central engaging members 44a, one extending along the entire distance between the upper board coupling members 52a and the other extending along the entire distance between the lower board coupling members 52b. In yet a further alternate embodiment not illustrated, the two end engaging members 46 positioned adjacent to each other toward each end of the frame 38 may be joined to form an enlarged single end engaging member at each end of the frame.

An advantage of the alternate embodiments of the support 6 shown in FIGS. 5A and 5B is that they engage an increased area of the inner surface 14 of the circuit board 4. These alternate supports accordingly increase the resistance of the circuit board 4 to bending out of the board plane 13. In still further alternate embodiments, the support 6 includes engaging portions 42 that engage more or less area of the inner surfaces 14, and which also resist bending of the circuit board 4 out of the board plane 13.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A circuit board assembly for mounting to a rack, comprising:

a circuit board having first and second opposite-facing surfaces and defining a board plane;

a mounting member sized and shaped to be attached to the rack to support the mounting member; and a support comprising a frame positioned between the mounting member and the circuit board and proximate to the first surface of the circuit board, the frame including an engaging portion positioned to releasably engage the first surface of the circuit board to resist bending of the circuit board out of the board plane and toward the mounting member when the circuit board and the support are coupled together, the support further comprising a board coupler connected to the frame and positioned to be removably coupled to the circuit board, and a mount coupler connected to the frame and positioned to be removably coupled to the mounting member, the mount coupler having at least one coupler member arranged to releasably attach to the mounting member, whereby the support and the mounting member can be removably coupled together without the use of separate fasteners.

2. The assembly of claim 1 wherein the circuit board has first and second opposite end portions and an intermediate portion therebetween and the engaging portion is positioned to releasably engage the first surface of the circuit board toward both the first and second end portions thereof.

3. The assembly of claim 2 wherein the engaging portion is positioned to releasably engage the first surface of the circuit board toward the intermediate portion thereof.

4. The assembly of claim 3 wherein the board coupler engages the second surface of the circuit board and holds the first surface of the circuit board in engagement with the engaging portion.

5. The assembly of claim 1 wherein the first surface of the circuit board has first and second opposite end portions and an intermediate portion therebetween, and the engaging portion includes a first engaging member positioned to releasably engage the first surface of the circuit board toward the first end portion thereof, a second engaging member positioned to releasably engage the first surface of the circuit board toward the second end portion thereof, and a third engaging member positioned to releasably engage the first surface of the circuit board toward the intermediate portion thereof, and wherein the board coupler holds the first surface of the circuit board in engagement with the first, second, and third engaging members.

6. The assembly of claim 1 wherein the board coupler releasably engages the second surface of the circuit board and biases the circuit board toward the engaging portion and resists movement of the circuit board out of the board plane and away from the mounting member when the circuit board and the support are coupled together.

7. The assembly of claim 1 wherein the circuit board has an aperture extending between the first and second surfaces thereof and the board coupler extends through the aperture and releasably engages the second surface of the circuit board, biases the circuit board into engagement with the engaging portion, and resists movement of the circuit board out of the board plane and away from the mounting member when the circuit board and the support are coupled together.

8. The assembly of claim 1 wherein the board coupler includes a first board coupling member and a second board coupling member having a shape different than a shape of the first board coupling member, the circuit board having a first aperture sized and shaped to releasably engage the first board coupling member and a second aperture sized and shaped to releasably engage the second board coupling member while substantially preventing engagement with the first board coupling member to allow coupling of the circuit board to the support only in a selected orientation.

9. The assembly of claim 1 for use with a rack having first and second spaced apart rack members, wherein the mounting member is sized to extend fully between and attach to the first and second rack members.

10. The assembly of claim 1, further comprising an electrical connector member attached to the circuit board and configured to engage electrical leads.

11. The assembly of claim 10 wherein the electrical connector member has a first portion positioned proximate to the first surface of the circuit board and a second portion positioned proximate to the second surface of the circuit board.

12. The assembly of claim 10 wherein the electrical connector member has a jack receptacle configured to removably receive a jack plug therein.

13. The assembly of claim 1 wherein the frame extends around a frame opening, further comprising an electrical connector member connected to the circuit board and positioned to extend away from the first surface of the circuit board and at least partially into the frame opening.

14. The assembly of claim 1 wherein the mounting member includes a flange portion positioned to resist bending of the mounting member.

15. A circuit board assembly for mounting to a rack, comprising:
 a circuit board having first and second opposite-facing surfaces and defining a board plane;
 a mounting member sized and shaped to be attached to the rack to support the mounting member; and
 a support comprising a frame positioned between the mounting member and the circuit board and proximate to the first surface of the circuit board, the frame including an engaging portion positioned to releasably engage the first surface of the circuit board to resist bending of the circuit board out of the board plane and toward the mounting member when the circuit board and the support are coupled together, the support further comprising a board coupler connected to the frame and positioned to be removably coupled to the circuit board, and a mount coupler connected to the frame and positioned to be removably coupled to the mounting member, the board coupler including a first board coupling member and a second board coupling member smaller than the first board coupling member, and wherein the circuit board has a first aperture and a second aperture, the first aperture being sized and shaped to releasably engage the first board coupling member, the second aperture being smaller than the first aperture and sized and shaped to releasably engage the second board coupling member while substantially preventing engagement with the first board coupling member to allow coupling of the circuit board to the support only in a selected orientation.

16. A circuit board assembly for mounting to a rack, comprising:
 a circuit board having first and second opposite-facing surfaces and defining a board plane;
 a mounting member sized and shaped to be attached to the rack to support the mounting member; and
 a support comprising a frame positioned between the mounting member and the circuit board and proximate to the first surface of the circuit board, the frame including an engaging portion positioned to releasably engage the first surface of the circuit board to resist bending of the circuit board out of the board plane and toward the mounting member when the circuit board and the support are coupled together, the support further comprising a board coupler connected to the frame and positioned to be removably coupled to the circuit board, and a mount coupler connected to the frame and positioned to be removably coupled to the mounting member, wherein the mounting member has a first surface facing the support, a second surface facing opposite the first surface, and an aperture extending between the first and second surfaces of the mounting member, the mount coupler positioned to extend through the aperture and releasably engage the second surface of the mounting member when the mount coupler is coupled to the mounting member.

17. The assembly of claim 16 wherein the mount coupler includes a first mount coupling member connected to the frame toward a first end portion thereof and a second mount coupling member connected to the frame toward a second end portion thereof, the first and second mount coupling members positioned to extend through the aperture and releasably engage the second surface of the mounting member when the mount coupler is coupled to the mounting member.

18. The assembly of claim 16 wherein the mount coupler has a tab member connected thereto and the mount member aperture has a tab receiving notch sized and shaped to engage the tab member when the mount coupler is coupled to the mounting member in a selected orientation.

19. A circuit board assembly for mounting to a rack having two spaced apart rack members, the assembly comprising:
 a circuit board defining a board plane and having first and second opposite-facing surfaces and an aperture extending therebetween, the circuit board supporting electrical connector members;
 a mounting member sized and shaped to extend between the rack members and attachable to the rack members to support the mounting member, the mounting member having first and second opposite-facing surfaces and an aperture extending therebetween; and a support comprising a frame positioned between the mounting member and the circuit board and proximate to the first surface of the circuit board, the frame including an engaging portion positioned to releasably engage the first surface of the circuit board to resist bending of the circuit board out of the board plane and toward the mounting member when the circuit board and the support are coupled together, the support further comprising a board coupler connected to the frame and positioned to extend through the circuit board aperture and releasably engage the second surface of the circuit board, and a mount coupler connected to the frame and positioned to extend through the mounting member aperture to releasably engage the first surface of the mounting member, the board coupler holding the circuit board in position with the electrical connector members at the mounting member aperture when the circuit board is coupled to the support by the board coupler.

20. The assembly of claim 19 wherein the circuit board is at least partially flexible in a normal direction substantially normal to the board plane and the frame is substantially rigid in the normal direction.

21. The assembly of claim 19 wherein the circuit board is at least partially flexible in a normal direction substantially normal to the board plane and the engaging portion is substantially rigid in the normal direction to resist movement of the circuit board in the normal direction toward the mounting member.

22. The assembly of claim 19 wherein the engaging portion includes a substantially flat engaging surface positioned to releasably engage the first surface of the circuit board when the circuit board is coupled to the board coupler.

23. A support for connecting a circuit board, having first and second opposite-facing surfaces and defining a board plane, to a mounting member sized and shaped to be attached to a rack to support the mounting member, the support comprising:

a frame positioned between the mounting member and the circuit board and proximate to the first surface of the circuit board, the frame including an engaging portion positioned to releasably engage the first surface of the circuit board to resist bending of the circuit board out of the board plane and toward the mounting member when the circuit board and the support are coupled together, the support further comprising a board coupler connected to the frame and positioned to be removably coupled to the circuit board, and a mount coupler connected to the frame and positioned to be removably coupled to the mounting member, the board coupler including at least one resilient coupling member arranged and having sufficient resiliency to bend when passing the circuit board as the circuit board and the support are being moved together for coupling and to return to a circuit board retaining position when the circuit board and the support are together, whereby the circuit board and the support can be removably coupled together without use of separate fasteners.

24. The assembly of claim 23 wherein the circuit board has first and second opposite end portions and an intermediate portion therebetween and the engaging portion is positioned to releasably engage the first surface of the circuit board toward both the first and second end portions thereof.

25. The assembly of claim 23 wherein the engaging portion is positioned to releasably engage the first surface of the circuit board toward the intermediate portion thereof.

26. The assembly of claim 25 wherein the board coupler engages the second surface of the circuit board and holds the first surface of the circuit board in engagement with the engaging portion.

27. The assembly of claim 23 wherein the board coupler releasably engages the second surface of the circuit board and biases the circuit board toward the engaging portion and resists movement of the circuit board out of the board plane and away from the mounting member when the circuit board and the support are coupled together.

28. The assembly of claim 23, further comprising an electrical connector member attached to the circuit board and configured to engage electrical leads.

29. A support for conecting a circuit board having first and second opposite-facing surfaces and defining a board plane to a mounting member sized and shaped to be attached to a rack to support the mounting member, the support comprising:

a frame positioned between the mounting member and the circuit board and proximate to the first surface of the circuit board, the frame including an engaging portion positioned to releasably engage the first surface of the circuit board to resist bending of the circuit board out of the board plane and toward the mounting member when the circuit board and the support are coupled together, the support further comprising a board coupler connected to the frame and positioned to be removably coupled to the circuit board, and a mount coupler connected to the frame and positioned to be removably coupled to the mounting member, the board coupler including a first board coupling member and a second board coupling member smaller than the first board coupling member, and wherein the circuit board has a first aperture and a second aperture, the first aperture being sized and shaped to releasably engage the first board coupling member, the second aperture being smaller than the first aperture and sized and shaped to releasably engage the second board coupling member while substantially preventing engagement with the first board coupling member to allow coupling of the circuit board to the support only in a selected orientation.

30. A support for connecting a circuit board having first and second opposite-facing surfaces and defining a board plane to a mounting member sized and shaped to be attached to a rack to support the mounting member, the support comprising:

a frame positioned between the mounting member and the circuit board and proximate to the first surface of the circuit board, the frame including an engaging portion positioned to releasably engage the first surface of the circuit board to resist bending of the circuit board out of the board plane and toward the mounting member when the circuit board and the support are coupled together, the support further comprising a board coupler connected to the frame and positioned to be removably coupled to the circuit board, and a mount coupler connected to the frame and positioned to be removably coupled to the mounting member, wherein the mounting member has a first surface facing the support, a second surface facing opposite the first surface, and an aperture extending between the first and second surfaces of the mounting member, and the mount coupler is positioned to extend through the aperture and releasably engage the second surface of the mounting member when the mount coupler is coupled to the mounting member.

31. The assembly of claim 30 wherein the mount coupler has a tab member connected thereto and the mount member aperture has a tab receiving notch sized and shaped to engage the tab member when the mount coupler is coupled to the mounting member in a selected orientation.

32. A circuit board assembly for mounting a plurality of circuit boards to a rack, comprising:
- at least first and second circuit boards, each of the first and second circuit boards having first and second opposite-facing surfaces and defining a board plane;
- a mounting member sized and shaped to be attached to the rack to support the mounting member; and
- at least first and second supports to support the first and second circuit boards, respectively, each of the first and second supports comprising a frame positioned between the mounting member and a corresponding one of the first and second circuit boards to be supported thereby and proximate to the first surface of the corresponding circuit board, the frame including an engaging portion positioned to releasably engage the first surface of the corresponding circuit board to resist bending of the corresponding circuit board out of the board plane thereof and toward the mounting member when the corresponding circuit board and support are coupled together, each of the first and second supports further comprising a board coupler connected to the frame thereof and positioned to be removably coupled to the corresponding circuit board, and a mount coupler connected to the frame thereof and positioned to be removably coupled to the mounting member.

33. A circuit board assembly for mounting a plurality of circuit boards to a rack having two spaced apart rack members, the assembly comprising:
- at least first and second circuit boards, each of the first and second circuit boards defining a board plane and having first and second opposite-facing surfaces with an aperture extending therebetween;
- at least first and second electrical connector members attached to the first and second circuit boards, respectively, each of the first and second connector members having first and second faces, and being located within the circuit board aperture of a corresponding one of the first and second circuit boards, the first and second connector members extending away from the first surface of the corresponding circuit board with the first face of the connector member spaced away from the first surface of the corresponding circuit board, the second faces of the first and second connector members being configured to engage electrical leads and being accessible for attachment of electrical leads from a direction of the second surface of the corresponding circuit board;
- a mounting member sized and shaped to extend between the rack members and attachable to the rack members to support the mounting member, the mounting member having first and second opposite-facing surfaces with at least first and second apertures extending therebetween in alignment with the first and second circuit board apertures, respectively, the first surface of the mounting member facing the first and second circuit boards; and
- at least first and second supports to support the first and second circuit boards, respectively, each of the first and second supports comprising a frame positioned between the mounting member and the corresponding one of the first and second circuit boards to be supported thereby and proximate to the first surface of the corresponding circuit board, the frame including an engaging portion positioned to releasably engage the first surface of the corresponding circuit board along at least a perimeter portion of the circuit board aperture of the corresponding circuit board to resist bending of the corresponding circuit board out of the board plane thereof and toward the mounting member when the corresponding circuit board and support are coupled together, the frame of the first support having an aperture therethrough in alignment with the first circuit board and first mounting member apertures, and the frame of the second support having an aperture therethrough in alignment with the second circuit board and second mounting member apertures, the first and second connector members extending at least toward the first and second mounting member apertures, respectively, to position the first faces of the first and second connector members toward the first and second mounting member apertures, respectively, the frame and mounting member apertures of the first and second supports being sized to provide access to the first faces of the first and second connector members, respectively, from a direction of the second surface of the mounting member, the first and second supports each further comprising a board coupler connected to the frame thereof and positioned to releasably engage the corresponding circuit board, and a mount coupler connected to the frame thereof and positioned to releasably engage the mounting member, the board couplers holding the first and second circuit boards in position with the first faces of the first and second connector members toward the first and second mounting member apertures, respectively, when the first and second circuit boards are coupled to the first and second supports by the board couplers thereof.

34. A circuit board assembly for mounting to a rack having two spaced apart rack members, the assembly comprising:
- a circuit board defining a board plane, and having first and second opposite-facing surfaces with an aperture extending therebetween;
- an electrical connector member having first and second faces, and being located within the circuit board aperture and attached to the circuit board, the connector member extending away from the first surface of the circuit board with the first face of the connector member spaced away from the first surface of the circuit board, the second face of the connector member being configured to engage electrical leads and being accessible for attachment of electrical leads from a direction of the second surface of the circuit board;
- a mounting member sized and shaped to extend between the rack members and attachable to the rack members to support the mounting member, the mounting member having first and second opposite-facing surfaces with an aperture extending therebetween in alignment with the circuit board aperture, the first surface of the mounting member facing the circuit board; and
- a support comprising a frame positioned between the mounting member and the circuit board and proximate to the first surface of the circuit board, the frame including an engaging portion positioned to releasably engage the first surface of the circuit board along at least a perimeter portion of the circuit board aperture to resist bending of the circuit board out of the board plane and toward the mounting member when the circuit board and the support are coupled together, the frame having an aperture therethrough in alignment with the circuit board and mounting member apertures, the connector member extending at least toward the mounting member aperture to position the first face of the connector member toward the mounting member aperture, the frame and mounting member apertures being sized to provide access to the first face of the connector member from a direction of the second surface of the mounting member, the support further comprising a board coupler connected to the frame and positioned to releasably engage the circuit board, and a mount coupler connected to the frame and positioned to releasably engage the mounting member, the board coupler holding the circuit board in position with the first face of the connector member toward the mounting member aperture when the circuit board is coupled to the support by the board coupler.

35. The assembly of claim 34 wherein the connector member extends into the frame aperture and the first face of the connector member is located adjacent to the mounting member aperture.

36. The assembly of claim 34 wherein the board coupler releasably engages the second surface of the circuit board and biases the circuit board toward the engaging portion and resists movement of the circuit board out of the board plane and away from the mounting member when the circuit board and the support are coupled together.

37. The assembly of claim 34 wherein the mount coupler is positioned to extend through the mounting member aperture and releasably engage the second surface of the mounting member when the mount coupler is coupled to the mounting member.

38. The assembly of claim 34 wherein the board coupler includes a first board coupling member and a second board coupling member smaller than the first board coupling member, and the circuit board has a first attachment aperture and a second attachment aperture, the first attachment aperture being sized and shaped to releasably engage the first board coupling member, the second attachment aperture being smaller than the first attachment aperture and sized and shaped to releasably engage the second board coupling member while substantially preventing engagement with the first board coupling member to allow coupling of the circuit board to the support only in a selected orientation.

39. The assembly of claim 38 wherein the mount coupler has a tab member connected thereto and the mount member aperture has a tab receiving notch sized and shaped to engage the tab member when the mount coupler is coupled to the mounting member in a selected orientation.

40. The assembly of claim 34 wherein the circuit board has an attachment aperture and the board coupler is positioned to extend through the circuit board attachment aperture and releasably engage the second surface of the circuit board, and the mount coupler is positioned to extend through the mounting member aperture to releasably engage the second surface of the mounting member.

41. The assembly of claim 34 wherein the board coupler includes at least one resilient coupling member arranged and having sufficient resiliency to bend when passing the circuit board as the circuit board and the support are being moved together for coupling and to return to a circuit board retaining position when the circuit board and the support are together, whereby the circuit board and the support can be releasably coupled together without use of separate fasteners.

42. A support for connecting a circuit board, having first and second opposite-facing surfaces with an aperture therethrough and defining a board plane, to a mounting member sized and shaped to be attached to a rack to support the mounting member, the mounting member having first and second opposite-facing surfaces with an aperture therethrough, the circuit board having an electrical connector member with first and second faces which is located in the circuit board aperture and attached to the circuit board, the connector member extending away form the first surface of the circuit board with the first face of the connector member spaced away from the first surface of the circuit board, the support comprising:

a frame positioned between the mounting member and the circuit board and proximate to the first surface of the circuit board, the frame including an engaging portion positioned to releasably engage the first surface of the circuit board along at least a perimeter portion of the circuit board aperture to resist bending of the circuit board out of the board plane and toward the mounting member when the circuit board and the support are coupled together, the frame having an aperture therethrough in alignment with the circuit board and mounting member apertures, the frame being sized and the frame aperture located to position the first face of the connector member toward the mounting member aperture for access to the first face from a direction of the second surface of the mounting member, the support further comprising a board coupler connected to the frame and positioned to be removably coupled to the circuit board, and a mount coupler connected to the frame and positioned to be removably coupled to the mounting member.

43. A support for connecting a circuit board, having first and second opposite-facing surfaces and defining a board plane, to a mounting member sized and shaped to be attached to a rack to support the mounting member, the support comprising:

a frame positioned between the mounting member and the circuit board and proximate to the first surface of the circuit board, the frame including an engaging portion positioned to releasably engage the first surface of the circuit board to resist bending of the circuit board out of the board plane and toward the mounting member when the circuit board and the support are coupled together, the support further comprising a board coupler connected to the frame and positioned to be removably coupled to the circuit board, and a mount coupler connected to the frame and positioned to be removably coupled to the mounting member, the board coupler including at least one resilient coupling member arranged and having sufficient resiliency to bend when passing the circuit board as the circuit board and the support are being moved together for coupling and to return to a circuit board retaining position when the circuit board and the support are together, whereby the circuit board and the support can be removably coupled together without use of separate fasteners.

* * * * *

UNITED STATES PATENT AND TRADEMARK OFFICE
CERTIFICATE OF CORRECTION

PATENT NO. : 6,238,243 B1
DATED : May 29, 2001
INVENTOR(S) : Alan S. Lorenz and William D. Regester It is certified that error appears in the above-identified patent and that said Letters Patent is hereby corrected as shown below:

Column 16, claim 42,
Line 10, "extending away form the" should read -- extending away from the --.

Signed and Sealed this

Eighth Day of January, 2002

Attest:

Attesting Officer

JAMES E. ROGAN
Director of the United States Patent and Trademark Office